United States Patent
Saito et al.

[11] Patent Number: 5,951,814
[45] Date of Patent: Sep. 14, 1999

[54] ELECTRODE FOR PLASMA ETCHING

[75] Inventors: Kazuo Saito; Yasushi Mochizuki; Akira Yamaguchi, all of Tokyo, Japan

[73] Assignee: Nisshinbo Industries, Inc., Tokyo, Japan

[21] Appl. No.: 08/837,468

[22] Filed: Apr. 18, 1997

[30] Foreign Application Priority Data

Apr. 22, 1996 [JP] Japan .................................. 8-124074

[51] Int. Cl.$^6$ ...................................................... H05H 1/00
[52] U.S. Cl. ................ 156/345; 204/298.31; 204/298.33
[58] Field of Search ........................ 156/345; 118/712 E; 204/298.33, 298.34, 298.31, 298.14, 298.07

[56] References Cited

U.S. PATENT DOCUMENTS 5,324,411  6/1994  Ichishima et al. .................. 156/345 X

FOREIGN PATENT DOCUMENTS

| 0 421686A2 | 4/1991 | European Pat. Off. . |
| 0 678894A1 | 10/1995 | European Pat. Off. . |
| 61-224423 | 10/1986 | Japan . |
| 0 4063606 | 2/1992 | Japan . |
| 0 7033524 | 2/1995 | Japan . |
| 9 513927 | 5/1995 | WIPO . |

*Primary Examiner*—Thi Dang
*Attorney, Agent, or Firm*—Birch, Stewart Kolasch & Birch, LLP

[57] ABSTRACT

Disclosed is an electrode for plasma etching, which is inexpensive and is capable of reducing the generation of dust and keeping a high electrode performance. The electrode includes a portion to be consumed by plasma and the remaining portion, wherein the portion to be consumed by plasma is formed of metal silicon or a glassy carbon material, and the remaining portion is formed of a carbon material covered with a film of a glassy carbon material.

2 Claims, 4 Drawing Sheets

ELECTRODE FOR PLASMA ETCHING

BACKGROUND OF THE INVENTION

The present invention relates to an electrode for plasma etching used for production of semiconductor integrated circuits, such as LSIs or ICs, or waveguides for optical communication.

In recent years, a plasma etching technique capable of forming a finer pattern on a wafer at a high accuracy has come to be increasingly important along with the advance of techniques for producing semiconductor integrated circuits with finer-geometries and higher densities.

In such a plasma etching process, there have been used electrodes formed of aluminum, graphite, glassy carbon, silicon, quartz, and the like. Of these electrodes, those formed of silicon and glassy carbon have been used particularly for production of semiconductors with finer-geometries and higher integration.

The electrodes formed of silicon and glassy carbon, however, are expensive, and therefore, it has been required to develop an inexpensive electrode in place of such expensive electrodes.

SUMMARY OF THE INVENTION

An object of the present invention is to provide an electrode for plasma etching, which is reduced in cost while keeping a high electrode performance.

The present inventor has earnestly studied to achieve the above object, and found that an electrode for plasma etching, which is reduced in cost while enabling high accurate etching, can be obtained by a method wherein a portion to be consumed by plasma is formed of silicon or a glassy carbon material and the remaining portion is formed of a carbon material covered with a film of a glassy carbon material.

In an etching electrode, although its shape is varied depending on the application, a portion to be actually consumed and to directly exert an effect on etching characteristics by, for example, generation of dust is a portion being in contact with plasma. However, in the existing electrode, the remaining portion such as an electrode mounting portion is also formed of an expensive single material such as silicon or a glassy carbon material. Such an etching electrode is replaced when only part of the surface of the electrode is consumed, and the spent electrode is discarded. In other words, the entire expensive material is discard after only part thereof is consumed, which leads to the increased running cost of plasma etching using such an electrode, resulting in the increased cost of semiconductors processed by the plasma etching.

To cope with such an inconvenience, it may be considered that a portion of an electrode to be consumed by plasma is formed of silicon or a glassy carbon material just as in the conventional electrode and the remaining portion is formed of an inexpensive material having a conductivity required for the electrode, and from this viewpoint, an examination has been made by the present inventor to use a carbon material, for example, graphite as a material forming a portion other than a portion to be consumed by plasma. However, it has been found that in the case where a portion other than a portion to be consumed by plasma is simply formed of a carbon material, there occurs a problem that particles (or dust) are fallen off from the portion formed of the carbon material and are stuck on the surface of a workpiece, such as a wafer, during its being processed by plasma etching. Accordingly, the present inventor has further proceeded the examination of the plasma etching electrode in terms of reduction in generation of dust, and found that the fall-off of particles can be prevented by covering the surface of the carbon material with a glassy carbon material exhibiting a sufficient conductivity, and that an electrode for plasma etching, which is reduced in cost while keeping a high performance, can be obtained by a combination of such a material covered with a glassy carbon material and silicon or a glassy carbon material. On the basis of the above knowledge, the present invention has been accomplished.

Therefore, to achieve the above object, according to the present invention, there is provided an electrode for plasma etching, including a portion to be consumed by plasma and the remaining portion, wherein the portion to be consumed by plasma is formed of silicon or a glassy carbon material, and the remaining portion is formed of a carbon material covered with a film of a glassy carbon material.

BRIEF DESCRIPTION OF THE DRAWINGS

The present invention disclosed herein will be understood better with reference to the following drawing of which.

DESCRIPTION OF THE PREFERRED EMBODIMENTS

Figure 1:
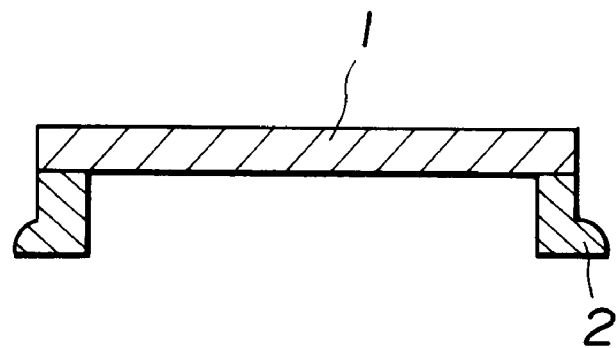
FIG. 1 is a sectional view of an electrode according to a first embodiment of the present invention.
Figure 2:
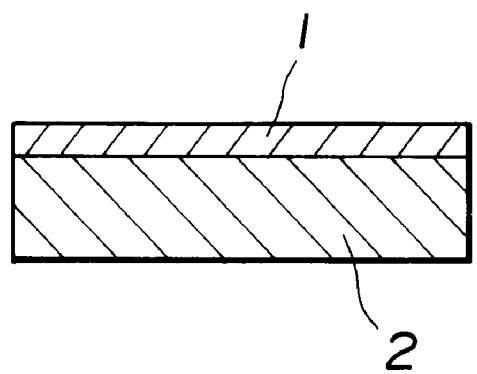
FIG. 2 is a sectional view of an electrode according to a second embodiment of the present invention.
Figure 3:
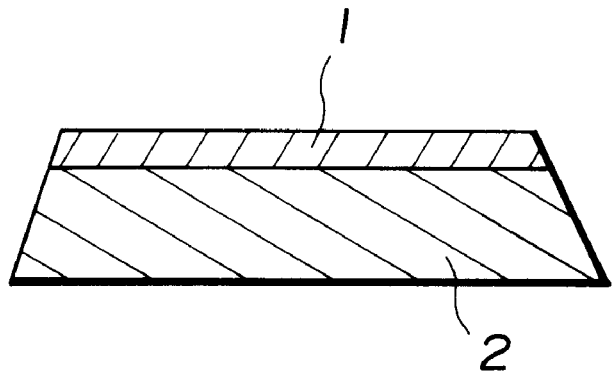
FIG. 3 is a sectional view of an electrode according to a third embodiment of the present invention.
Figure 4:
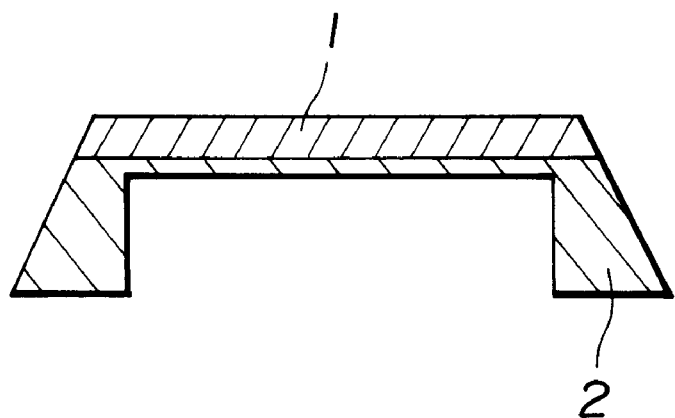
FIG. 4 is a sectional view of an electrode according to a fourth embodiment of the present invention.

The preferred embodiments of the present invention will be described with reference to the accompanying drawings.

An electrode for plasma etching according to the present invention may be formed in such a shape as shown in FIGS. 1 to 4. In the electrode having such a shape, a portion 1 to be in contact with plasma and consumed by plasma is formed of silicon or a glassy carbon material, and the remaining portion 2 not to be directly in contact with plasma is formed of a carbon material covered with a glassy carbon material. In addition, the shape of the electrode of the present invention is not limited to those shown in the figures.

In the case where the portion 1 to be consumed by plasma is formed of silicon, it may be of either a single crystal type or a polycrystalline type. On the other hand, in the case where the portion 1 is formed of a glassy carbon material, it may be produced from a source material selected from cellulose, furfuryl alcohol, phenol resin, acetone, polycarbodiimide resin, furan resin, furfural resin, other thermosetting resins, and mixtures thereof.

On the other hand, as a carbon material forming a portion 2 not to be consumed, there may be used a general carbon material such as graphite. The covering of such a carbon material with a glassy carbon material can be performed by a manner of covering the surface of the carbon material with a solution of a source material dissolved in solvent by vacuum impregnation, ultrasonic impregnation, brush coating, or spraying, followed by baking. In this case, as the above source material of the glassy carbon material, there may be used a material selected from cellulose, furfuryl alcohol, phenol resin, acetone, polycarbodiimide resin, furan resin, furfural resin, other thermosetting resins, and mixtures thereof; and further pitch, and decomposed resins. Alternatively, the covering of the glassy carbon material can be performed by sputtering or plasma CVD. It is to be noted that the above-described method of covering the surface of the carbon material with the glassy carbon material is for illustrative purposes only and many changes may be made within the scope of the present invention. The thickness of the film of the glassy carbon material may be in a range of 0.1 to 500 μm, preferably, in a range of 0.5 to 200 μm in terms of strength and wear resistance.

The portion 1 formed of silicon or a glassy carbon material can be joined to the portion 2 formed of a carbon material covered with a glassy carbon material by bolt-fastening; brazing using a brazing filler metal; screwing; or adhesive bonding using an organic adhesive, a carbon adhesive, or a conductive adhesive. The joining of the portion 1 to the portion 2 is not particularly limited, but it may be performed in such a manner as to ensure a conductivity required for the electrode.

With respect to the electrode of the present invention, the surface, particularly, the surface to be in contact with plasma can be polished by, while not restrictively, lapping using abrasives, buffing, or electrolytic polishing. In this case, the surface roughness may be specified such that Ra defined in JIS-B0601 is in a range of from 0.001 to 0.5 μm, preferably, in a range of 0.001 to 0.015 μm, and Rmax is in a range of from 0.001 to 2 μm, preferably, in a range of from 0.01 to 0.15 μm. Such a surface roughness is effective to significantly suppress the generation of dust.

The plasma etching electrode of the present invention can be formed with a suitable number of through-holes for allowing a reaction gas to smoothly flow in a plasma region therethrough. Such a through-hole can be formed by ultrasonic machining, electric discharge machining, drilling, laser machining, or water jet machining.

The plasma etching electrode of the present invention is most suitable for parallel flat type plasma etching, but it can be used for a general plasma etching process; and the plasma etching using such an electrode can be performed under normal conditions.

EXAMPLE

The present invention will be more clearly understood with reference to the following examples, but it is to be noted that such examples are for illustrative purposes only and are not intended to limit the present invention.

Examples 1 and 2

Figure 5:
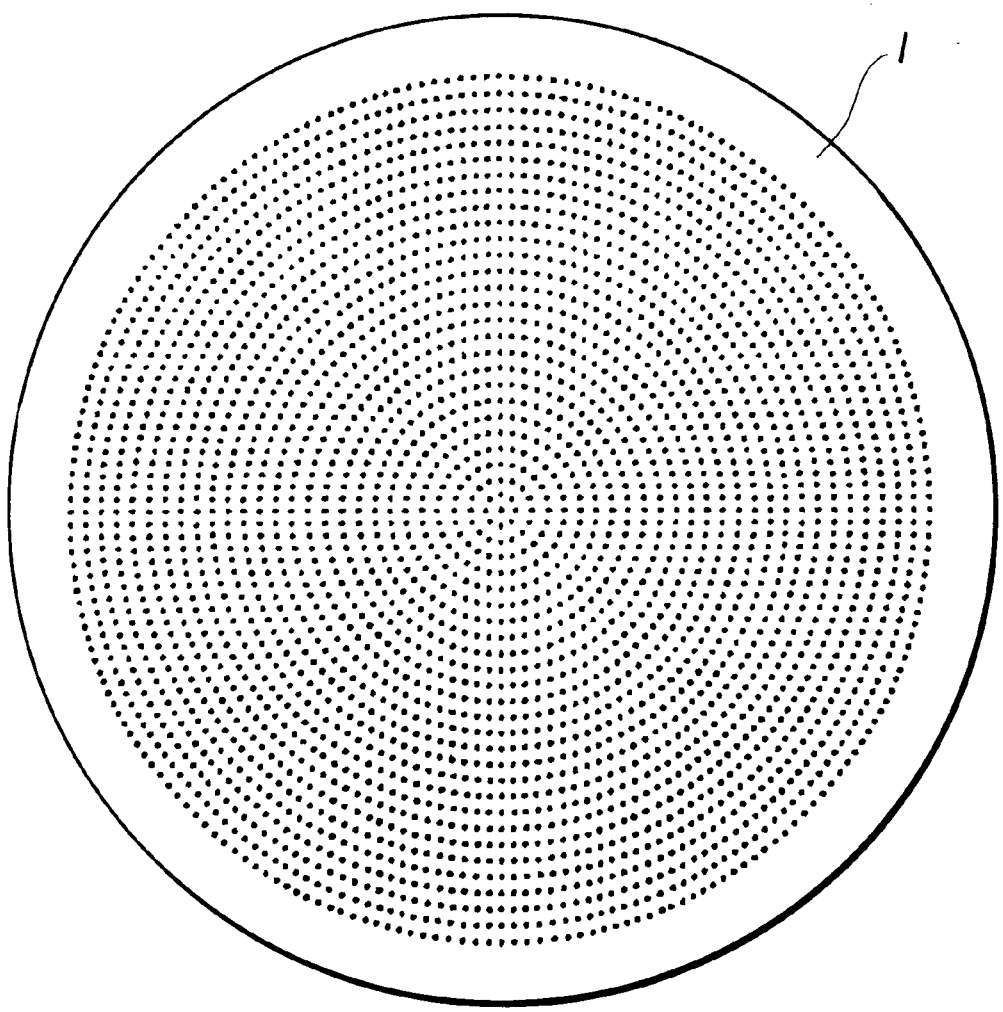
FIG. 5 is a plan view of an electrode according to a fifth embodiment of the present invention.
Figure 6:
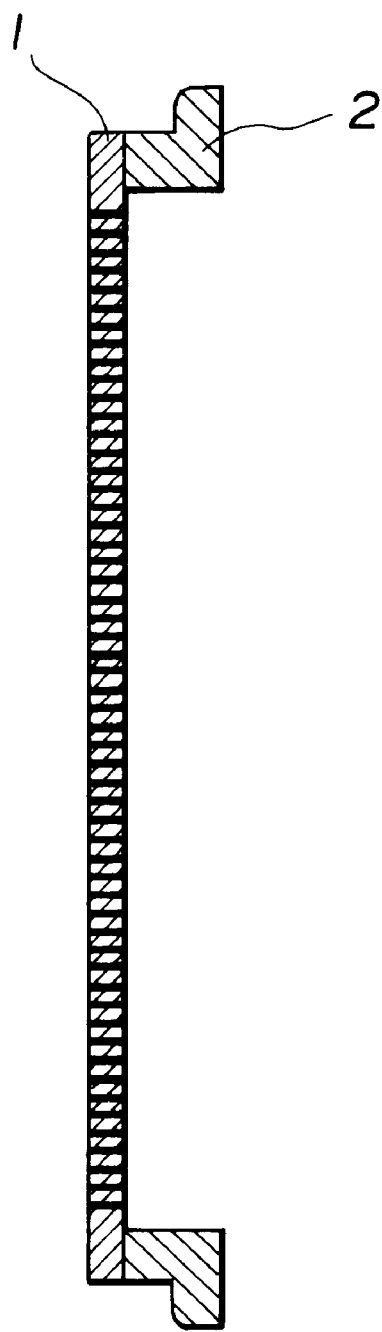
FIG. 6 is a sectional view of the electrode according to the fifth embodiment of the present invention.

A portion 1 of an electrode sample to be consumed by plasma, shown in FIGS. 5 and 6, was prepared by machining a single crystal silicon member doped with P-type boron (resistance: 15 Ωcm) into a size (thickness: 7 mm, diameter: 223.5 mm), forming holes (diameter: 0.84 mm) in the number of 3025 pieces in the surface of the member by drilling, and polishing the surface using a lapping machine. Also, a portion 1 to be consumed by plasma was prepared using a glassy carbon plate (concentration of impurities: 2 ppm, thickness: 5 mm) in the same manner as described above.

On the other hand, a portion 2 of the electrode sample not to be consumed by plasma, shown in FIG. 6, was prepared by machining an isotropic graphite member (density: 1.82 g/cm$^3$) into a ring shape (outside diameter: 241.5 mm, thickness: 19.05 mm), coating the entire surface of the ring-shaped graphite member with a polycarbodiimide resin by vacuum impregnation and spraying, putting the resultant in a baking furnace, and baking the polycarbodiimide resin in an inert atmosphere at a temperature of 2000° C. The thickness of the glassy carbon material film was 5 μm.

Each of the portions 1 was joined to the portion 2 by brazing using an indium filler, to thus obtain the electrode sample.

Comparative Examples 1, 2 and 3

Electrode samples were prepared by repeating the procedures of Examples 1 and 2, except that an isotropic graphite member not covered with a glassy carbon material was used as the portion 2 not to be consumed by plasma. In addition, an electrode sample, which was entirely formed of silicon, was prepared.

Next, each of the above electrode samples was set into a plasma etching system, and an oxide film on a silicon wafer (diameter: 8 inch) was etched by plasma using a mixed gas of trifluoromethane as a reaction gas, argon and oxygen. After this etching, the number of particles (particle size: 0.3 μm or more) adhering on the surface of the wafer was counted. The results are shown in Table 1.

From the results shown in Table 1, it is revealed that a plasma etching electrode according to the present invention is inexpensive and is excellent in electrode performance.

TABLE 1

|  |  | cost | number of particles |
|---|---|---|---|
| Example 1 | silicon + carbon material covered with glassy carbon | inexpensive | 3 |
| Example 2 | glassy carbon + carbon material covered with glassy carbon | inexpensive | 4 |
| Comparative Example 1 | silicon + carbon material | inexpensive | 58 |
| Comparative Example 2 | glassy carbon + carbon material | inexpensive | 70 |
| Comparative Example 3 | silicon | expensive | 7 |

We claim:

1. An electrode for plasma etching, comprising a portion to be consumed by plasma and the remaining portion, wherein said portion to be consumed by plasma is formed of silicon or a glassy carbon material, and said remaining portion is formed of a carbon material covered with a film of a glassy carbon material.

2. An electrode for plasma etching according to claim 1, wherein the thickness of said glassy carbon material film is in a range of from 0.1 to 500 μm.

* * * * *